INVENTOR.
RALPH M. PINCUS
BY [signature]
ATTORNEY

INVENTOR.
RALPH M. PINCUS
BY Herbert L. Davis
ATTORNEY

INVENTOR.
RALPH M. PINCUS
BY Herbert L. Davis

INVENTOR

INVENTOR.
RALPH M. PINCUS
BY Herbert L. Davis
ATTORNEY

INVENTOR.
RALPH M. PINCUS
BY Herbert L. Davis
ATTORNEY

United States Patent Office 3,427,560
Patented Feb. 11, 1969

3,427,560
DIRECT CURRENT AMPLIFIER
Ralph M. Pincus, Fort Lee, N.J., assignor to The Bendix Corporation, Teterboro, N.J., a corporation of Delaware
Filed June 9, 1965, Ser. No. 462,642
U.S. Cl. 330—69 8 Claims
Int. Cl. H03f *1/02, 21/00*

ABSTRACT OF THE DISCLOSURE

An amplifier network including a first amplifier responsive to an input signal for providing a signal having high frequency response characteristics. A second amplifier imparts variable gain characteristics to the signal from the first amplifier and a third amplifier provides a signal in response to the signal from the second amplifier for affecting the first amplifier so that the signal therefrom is in accordance with a predetermined relation. The signal from the second amplifier is used to provide supply voltages to all of the amplifiers, and which supply voltages float above and below said second amplifier signal.

This invention relates to direct current amplifiers and more particularly to direct current amplifiers having increased stability, high input impedance, variable gain characteristics, and operable over a wide frequency band width.

Direct current amplifiers are frequently used as control devices where the amplifier must respond to slowly varying input voltages. Consequently, the direct current amplifier must have sufficient gain capabilities to compensate for error voltages which may result when a change in the output voltage of the amplifier is not exactly equal to a change in the input voltage. The necessity for such a characteristic is evident when it is considered that the error voltage in a direct current amplifier circuit will decrease as the amplifier gain increases, and hence high gain characteristics are desirable to minimize this error voltage.

In order to provide precise control, it is also important that the amplifier has good direct current stability, or low drift characteristics, so that the output voltage is constant for a constant input voltage. For certain control applications, it is also advantageous, since the amplifier is a voltage sensitive device, that it exhibits high input impedance characteristics. Similarly, low output impedance characteristics are desirable since the amplifier may be required to supply current while performing its control function. High frequency response is advantageous so that, in a control application, response to a transient signal can be rapid, and a complementary low frequency response is similarly advantageous in order to render the amplifier usuable over a wide frequency band width.

The present invention satisfies the above-noted conditions by interconnecting three differential amplifier circuits to provide a direct current amplifier network. The first circuit includes a "forward amplifier" which has high frequency transfer characteristics, and which may be coupled to the output of a direct current source which serves as the input to the amplifier network. The forward amplifier is coupled to the direct current source through a resistance-capacitance network in order to provide the amplifier network with the proper high frequency response characteristics.

The second circuit includes a "bootstrap amplifier" which is coupled to an output of the forward amplifier through a variable attenuator, with the variable attenuator acting to select a portion of the output of the forward amplifier to be supplied as one of the inputs to the bootstrap amplifier. The variable attenuator thus provides the system with variable gain characteristics. Another input to the bootstrap amplifier is its own output. This bootstrapping effect, provided by connecting, as an input to the bootstrap amplifier, its own output, enables the bootstrap amplifier to compare its output with the input from the forward amplifier as selected by the variable attenuator. A null adjustment included in the bootstrap amplifier circuitry makes it possible for the bootstrap amplifier to maintain its output equal to its input which has been so selected.

The third circuit includes a "backward amplifier," which has, as one of its inputs, the output of the bootstrap amplifier. The other input to the backward amplifier is the output of the direct current signal source which is also provided as an input to the amplifier network as heretofore noted. The backward amplifier thus compares the bootstrap output to the output of the direct current signal source. The output of the backward amplifier is, therefore, a highly amplified error voltage resulting from said comparison. This error voltage may be coupled as another input to the forward amplifier, and will act to correct the output of the forward amplifier so that this output will have a relationship to the input from the direct current signal source depending upon the attenuation ratio provided by the variable attenuator. The output of the forward amplifier, being the output of the amplifier network including the forward, bootstrap and backward amplifiers, may be further coupled to an indicating network for subsequent use in a system such as an analog to digital converter.

The output of the bootstrap amplifier, coupled through an emitter follower to obtain low output impedance characteristics, further provides the input to a floating bootstrap power supply. This power supply provides floating voltages which are used for supply purposes in the several amplifier circuits and are referenced above and below the low impedance bootstrap voltage by a constant amount, thus maintaining a constant positive and negative voltage reference in respect to the bootstrap voltage, and thereby to the direct current source input which is related to the bootstrap voltage through the attenuator circuitry in the amplifier network as heretofore noted. Since these floating voltages maintain a constant reference to the direct current source input voltage, the current flowing through various impedances shunting the input voltage is maintained at a constant value so that the incremental input impedance will be high. When, for example, the input to the bootstrap amplifier selected by the variable attenuator as heretofore noted equals the output of the forward amplifier, the input voltage to the amplifier network will equal its output voltage. When the input voltage is equal to the output voltage, no current will flow and the effective input impedance in the network will approach infinity. Since the output of the amplifier network bears a relation to the input depending on the attenuation ratio, the amplifier network will assume high input impedance characteristics.

A wide frequency band width operating characteristic is achieved through the high frequency response capability of the forward amplifier provided by connecting the direct current signal source input to the forward amplifier through the resistance-capacitance network as heretofore noted, and the associated low frequency response capability is provided by directly connecting the output of the direct current signal source to the backward amplifier. A stable system with minimum drift effects is obtained by employing a configuration of balanced and matched transistors in the several differential amplifiers as will be hereinafter described.

It is an object of this invention to provide a direct current amplifier.

It is another object of this invention to provide a direct current amplifier having high input impedance and variable gain characteristics and operable with increased stability over a wide frequency band width.

It is another object of this invention to utilize a series of differential amplifiers arranged to provide an amplifier network having high input impedance and variable gain characteristics.

It is another object of this invention to provide a high input impedance, variable gain, direct current amplifier network by coupling a forward amplifier having good high frequency response, a bootstrap amplifier which compares its own output to a pre-selected input provided by the forward amplifier, and a backward amplifier that compares the output of the bootstrap amplifier with the input provided by a direct current source, to provide a correction voltage which is applied to the forward amplifier so that the output of the forward amplifier will have a relationship to another input from the direct current source.

It is another object of this invention to provide a direct current amplifier network by coupling the outputs of a forward amplifier, a bootstrap amplifier, and a backward amplifier, and to utilize the output of the bootstrap amplifier to generate supply voltages supplied to all of the amplifiers.

It is another object of this invention to provide a direct current amplifier network having an output coupled to an indicating network for subsequent use in a system such as analog to digital converter.

These and other objects and features of the invention are pointed out in the following description in terms of the embodiment thereof which is shown in the accompanying drawings. It is to be understood, however, that the drawings are for the purpose of illustration only and are not a definition of the limits of the invention, reference being had to the appended claims for this purpose.

Figure 1:
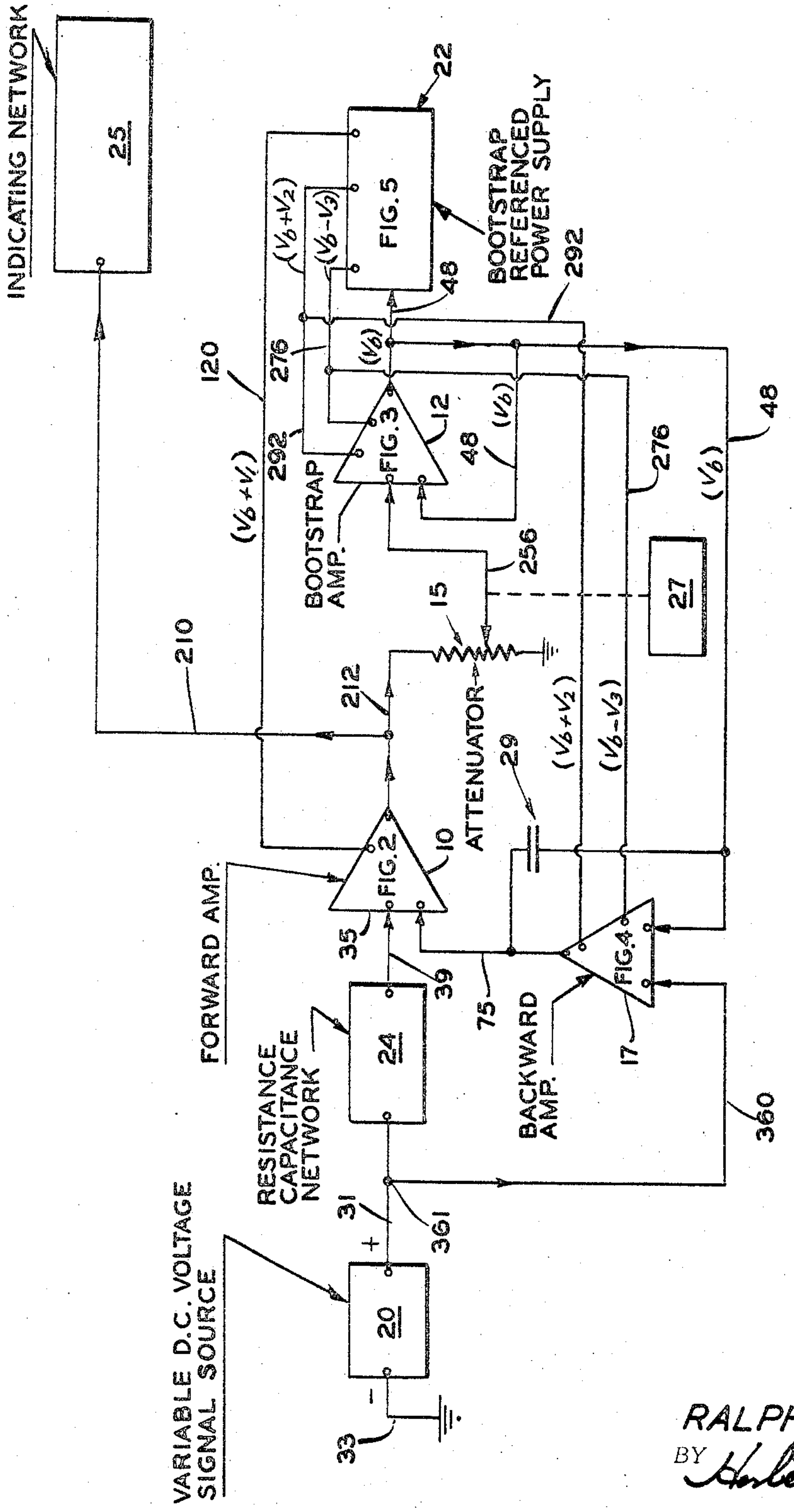
FIGURE 1 is a block diagram of the direct current amplifier network embodied in the present invention showing the relation of the various components included therein.
Figure 2:
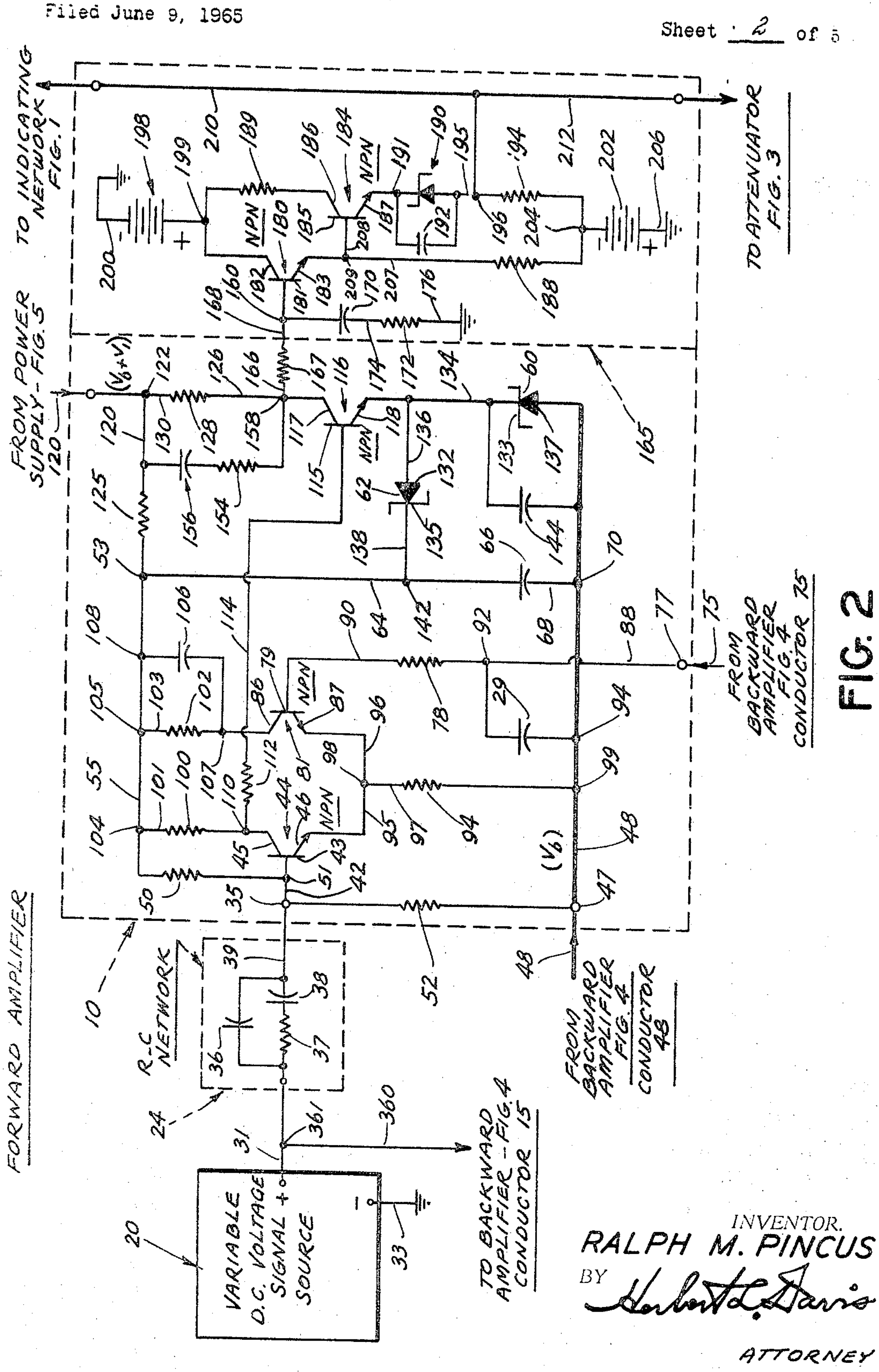
FIGURE 2 is a schematic wiring diagram of the forward amplifier included in the direct current amplifier network embodied in the present invention.
Figure 3:
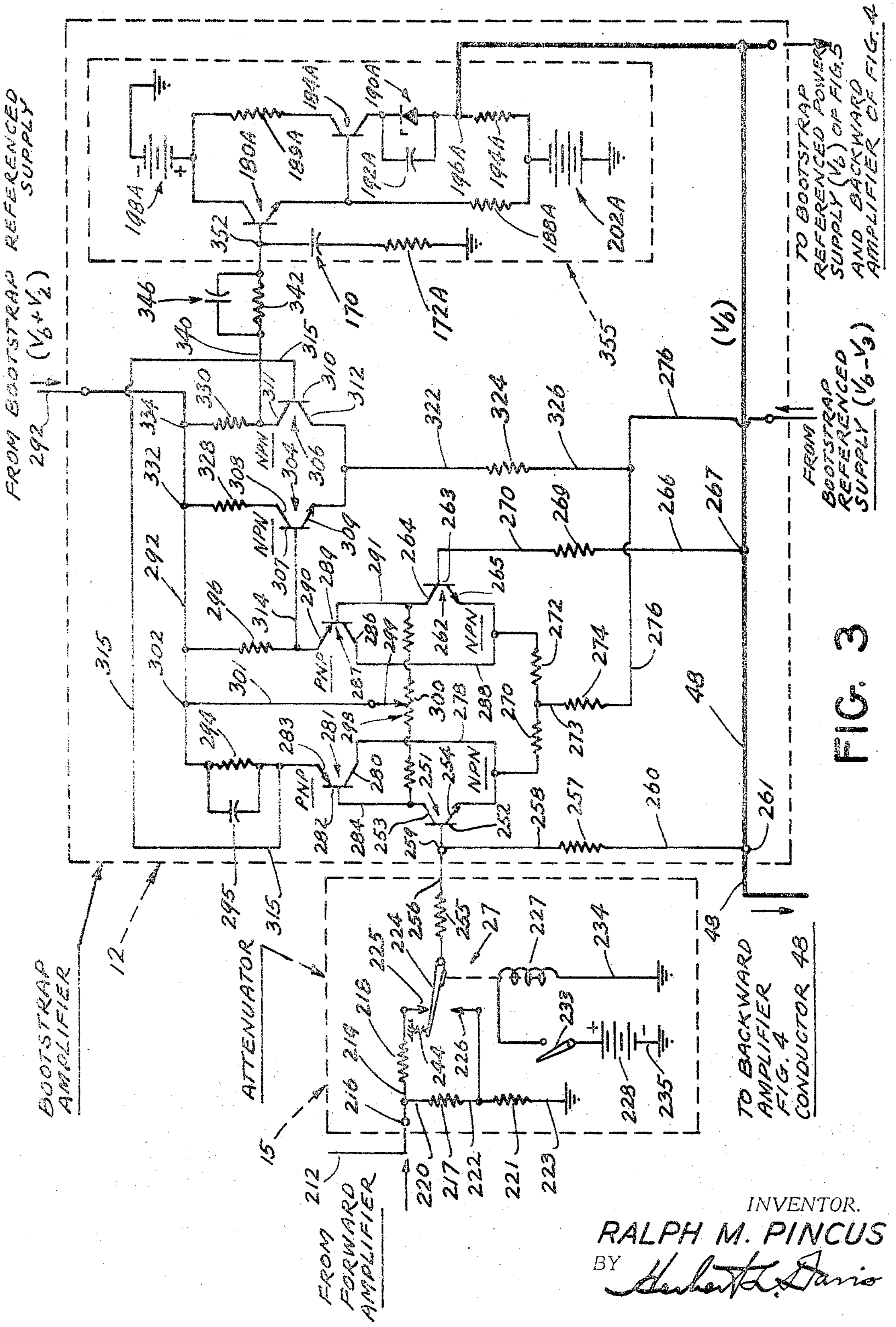
FIGURE 3 is a schematic wiring diagram of the bootstrap amplifier included in the direct current amplifier network of the present invention.

In reference to FIGURE 1, the direct current amplifier network shown in block diagram form therein consists essentially of three differential amplifier circuits: a forward amplifier 10, shown in detail in FIGURE 2, having a good high frequency response; a bootstrap amplifier 12, shown in detail in FIGURE 3, which has as one input a portion of the output of the forward amplifier

Figure 4:
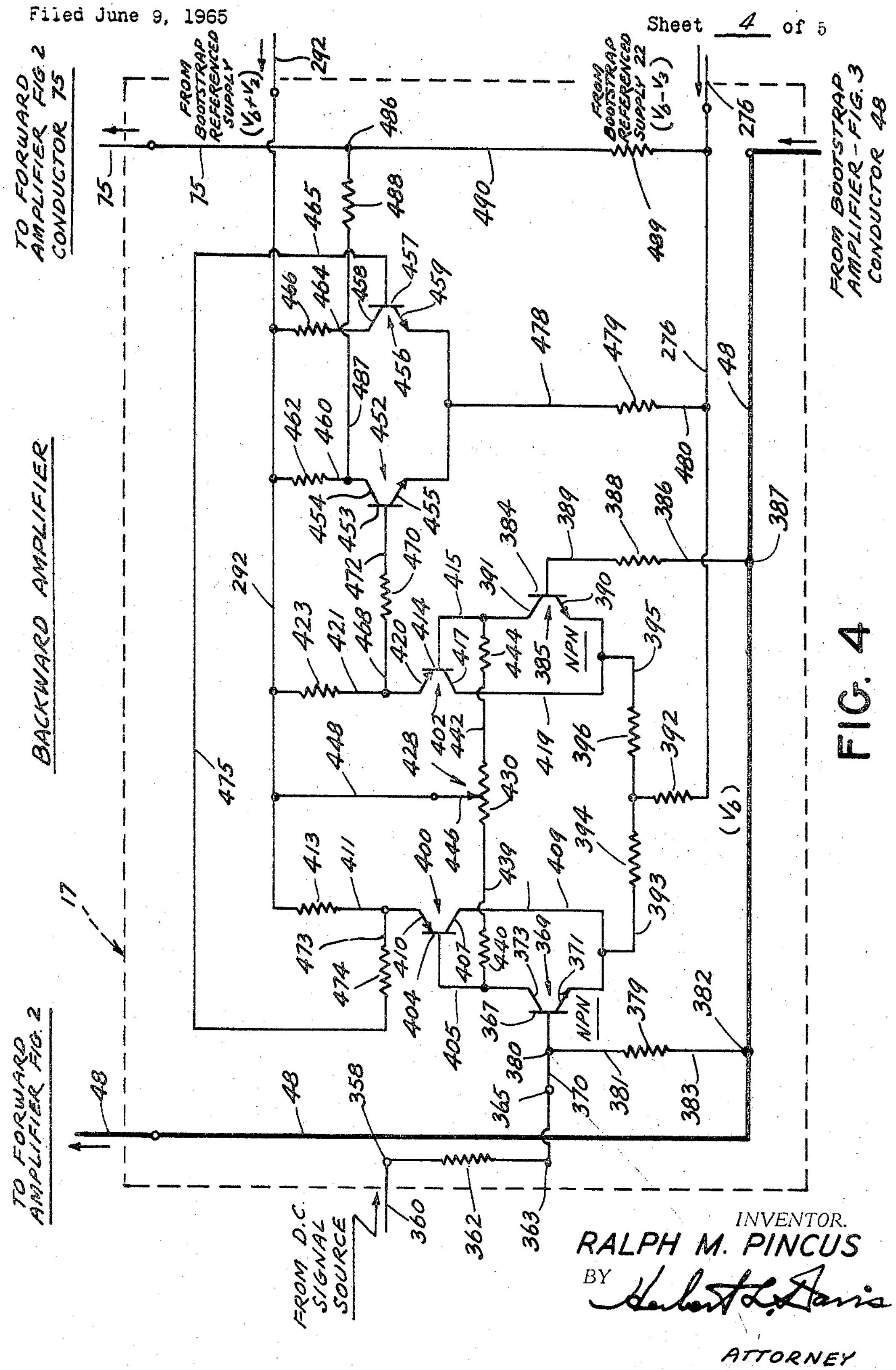
FIGURE 4 is a schematic wiring diagram of the backward amplifier included in the direct current amplifier network of the present invention.

10 as selected by an attenuator 15, and another input being its own output $V_b$, with the bootstrap amplifier 12 operating so that its output $V_b$ will always equal its input as selected by the attenuator 15; a backward amplifier 17, shown in detail in FIGURE 4, that compares the output $V_b$ of the bootstrap amplifier 12 with the input provided by a direct current voltage signal source 20 of a conventional type, providing a voltage signal varying in amplitude with a sensed condition or measured quantity, and the output of the backward amplifier 17 providing an input to the forward amplifier 10 which has another input from the direct current source 20, the output of the forward amplifier 10 being the output of the amplifier network. The output $V_b$ of the bootstrap amplifier 12, the bootstrap voltage, is further coupled to a bootstrap referenced power supply 22, shown in detail in FIGURE 5, which maintains voltages floating above and below the bootstrap voltage $V_b$ by a constant amount, thus providing a constant current drain and imparting high input impedance characteristics to the amplifier network since the bootstrap voltage $V_b$ and the input voltage to the bootstrap amplifier 12 are made to be equal as heretofore noted.

In further reference to FIGURE 1, an output from the direct current signal source 20 is coupled to an input of the forward amplifier 10 through a resistance-capacitance network 24. The network 24 functions to block passage to the forward amplifier 10 of the steady state component of the output of the variable direct current voltage signal source 20, and imparts high frequency response, alternating current characteristics to the forward amplifier 10. Another output from the variable direct current source 20 is coupled directly to an input of the backward amplifier 17, thus imparting low frequency, and direct current characteristics to the backward amplifier 17. The high frequency characteristics of the forward amplifier 10 and the low frequency characteristics of the backward amplifier 17 provide for operation of the amplifier network embodied in the present invention over a wide frequency range.

The output of the forward amplifier 10, which is the output of the amplifier network, may be coupled to a utilizing means such as an indicating network 25 and may further be coupled through the attenuator 15 to an input of the bootstrap amplifier 12. The attenuator 15 may, for purposes of illustration, be a two-step attenuator providing for unity of a gain of ten with a constant output impedance. An externally controlled relay 27 may be provided to select the desired gain, as shown by FIGURE 3.

The bootstrap amplifier 12 is a solid state device having stability as well as high gain characteristics. Successive stages in the bootstrap amplifier 12 provide for additional gain and a low output impedance. An adjustment is provided within the bootstrap amplifier 12 to null the bootstrap amplifier 12 so that its output will always equal its input from the forward amplifier 10 as selected by the attenuator 15.

The output of the bootstrap amplifier 12 is coupled to an input of the backward amplifier 17, with the other input to the backward amplifier 17 being the output of the variable direct current voltage signal source 20 as heretofore noted. The backward amplifier 17 is similar in construction and operation to the bootstrap amplifier 12 and acts to compare the input from the direct current source 20 with the output of the bootstrap amplifier 12. The output of the backward amplifier 17, therefore, is an amplified error voltage which is coupled to the forward amplifier 10 and filtered by a capacitor 29. This error voltage acts to correct the output of the forward amplifier 10 so that the output of the amplifier network will equal the input from the direct current source 20 when the attenuator 15 selects the full output of the forward amplifier 10 as an input to the bootstrap amplifier 12. When only a portion of the output of the amplifier 10 is so selected, this output of the amplifier network will equal the input from the variable direct current voltage signal source 20 multiplied by the inverse of the attenuation ration provided by the attenuator 15. A relationship between the input from the direct current voltage source 20 and the output of the amplifier network provided by the output of the amplifier 10 is thus established.

The output of the bootstrap amplifier 12 is further coupled to the bootstrap supply 22 which generates power supply voltages that float above and below the output $V_b$ of the bootstrap amplifier 12. These voltages are maintained at a constant level in respect to the bootstrap voltage $V_b$ by the use of Zener diodes and a transistor used in the power supply 22 to provide a constant current source as will be hereinafter explained in reference to FIGURE 5. Constant supply voltages are thus provided to the amplifier network independent of the voltage from the variable direct current voltage signal source 20. Since these voltages are maintained at a constant level relative to the bootstrap voltage $V_b$, high impedance characteristics are imparted to the amplifier network.

*Forward amplifier*

With the basic operation of the direct current amplifier embodied in the present invention shown in FIGURE 1 and described with reference thereto, the detailed operation of the various circuitry may now be described.

In reference then to FIGURE 2, which shows in detail the forward amplifier 10, the input voltage from the variable direct current voltage signal source 20 at output conductors 31–33 is coupled to the forward amplifier 10 by the conductor 31 connecting the positive terminal of the direct current source 20 to an input terminal 35 of the forward amplifier 10 through the resistance-capacitance network 24. The negative terminal of the direct current source 20 is connected to the grounded conductor 33. The resistance-capacitance network 24 includes a capacitor 36, a resistor 37, a capacitor 38 operably connected so as to block out the steady state portion of the output of the direct current source 20 taken across the output conductors 31–33, and thus pass through an output conductor 39 to the input terminal 35 of the forward amplifier 10 only the transient or alternating current portion thereof to impart high frequency response characteristics to the amplifier network.

The input at the input terminal 35 of the forward amplifier 10 is connected through a conductor 42 to a base 43 of an NPN type transistor 44, with the transistor 44 having a collector 45 and an emitter 46. The base 43 of the transistor 44 is biased through a resistor 50 and a resistor 52. The resistor 52 is joined at the terminal 35 to the conductor 42 leading to the base 43 of the transistor 44, and at a terminal 47 to a conductor 48 carrying the output voltage $V_b$ of the bootstrap amplifier 12, shown in detail in FIGURE 3. The resistor 50 is joined to the conductor 42 leading to the base 43 of the transistor 44 at a point 51 and is connected to a point 53 through a conductor 55. A voltage at the point 53 is provided by Zener diodes 60 and 62 in a manner as will be hereinafter explained. The voltage taken at the point 53 is filtered to the conductor 48 carrying the bootstrap voltage $V_b$ through a conductor 64, a capacitor 66 and a conductor 68 joining the conductor 48 at a point 70.

An error voltage is supplied through the output of the backward amplifier 17 to the forward amplifier 10 as shown in FIGURE 1 and the description thereof.

This error voltage is coupled to the forward amplifier 10 through an output conductor 75 of the backward amplifier 17, shown in detail in FIGURE 4, connected to an input terminal 77 of the forward amplifier 10. This output voltage of the backward amplifier 17 is connected from the input terminal 77 through a resistor 78 to a base 79 of an NPN type transistor 81. The transistor 81 has a collector 86 and an emitter 87, an input conductor 88 leads from the terminal 77 to the resistor 78 and a conductor 90 leads from the resistor 78 to the base 79 of the transistor 81 The capacitor 29, shown also in FIGURE 1, is connected to the input conductor 88 of the forward amplifier 10 at a point 92 and to the conductor 48 carrying the bootstrap voltage $V_b$ at a point 94. The capacitor 29 acts to filter the input to the forward amplifier 10 so as to remove the high frequency components from the input voltage supplied to the forward amplifier 10 from the backward amplifier 17.

The transistor 44 and the transistor 81 are a matched pair and are provided in the same container so as to isolate the circuit from errors due to transistor parameters. The emitter 46 of the transistor 44 and the emitter 87 of the transistor 81 are connected to a common resistor 94 through the conductors 95 and 96 joining a conductor 97 at a point 98. The resistor 94 is coupled to the conductor 48 carrying the bootstrap voltage $V_b$ at a point 99. The collector 45 of the transistor 44 and the collector 86 of the transistor 81 are coupled, through a resistor 100 and a conductor 101 and a resistor 102 and a conductor 103, respectively, at points 104 and 105 on the conductor 55 leading to the supply voltage provided by the Zener diodes 60 and 62 at the point 53. A bypass capacitor 106 is connected to the collector 86 of the transistor 81 at a point 107, and to the conductor 55 at a point 108. The capacitor 106 so connected across points 107–108 acts to impart to the amplifier 10 proper frequency roll-off characteristics, i.e. provide desirable frequency limits.

The output of the transistor 44 taken from an output terminal 110 on the collector 45 of the transistor 44, is coupled through a resistor 112 and a conductor 114 to a base 115 of an NPN type transistor 116. The transistor 116, having a collector 117 and an emitter 118, acts to amplify the output of the transistor 44.

The bootstrap voltage $V_b$ carried by the conductor 48 is connected to the emitter 118 of the transistor 116 through the Zener diode 60. The collector 117 of the transistor 116 is joined to a conductor 120 at a point 122 which is in turn connected through a resistor 125 to the point 53 on conductor 55. The collector 117 is connected to the point 122 through a conductor 126, a resistor 128, and a conductor 130.

An anode 132 of the Zener diode 62 is connected by a conductor 136 to a conductor 134 leading from the emitter 118 of the transistor 116 to a cathode 133 of the Zener diode 60. An anode 137 of the Zener diode 60 is connected to the conductor 48 carrying the output voltage $V_b$ from the bootstrap amplified 12.

The output at a cathode 135 of the Zener diode 62 is applied to an output conductor 138 which is coupled at a point 142 to the conductor 64 leading to the point 53 at which point the supply voltage may be detected. The Zener diodes 60 and 62, so connected, thus act to provide the supply voltage at the point 53 which is raised to a specific level above a bootstrap supply voltage $(V_b+V_1)$ applied at conductor 120 and which is generated in a manner as will be hereinafter explained.

A capacitor 144 and the capacitor 66 which are coupled across the Zener diodes 60 and 62, respectively act as high frequency bypass filters, and also act to remove excess noise from the aforenoted circuitry. A resistor 154 and a capacitor 156 are coupled across the resistor 128 and between the conductor 126 leading from the collector 117 of the transistor 116 and the conductor 120 so as to act to stabilize the frequency of the output of the transistor 116 at the conductor 126.

The output of the transistor 116 isfurther connected from an output terminal 158 of the collector 117 of the transistor 116 to an input terminal 160 of an emitter follower network 165, shown in FIGURE 2, through a conductor 166, a resistor 167 and a conductor 168. The input to the emitter follower network 165 is stabilized by a capacitor 170 and a resistor 172 with the input plate of the capacitor 170 joined to the emitter follower 165 at the input terminal 160, and the output plate of the capacitor 170 joined to the resistor 172 through a conductor 174 with the resistor 172 grounded by a conductor 176.

The emitter follower 165 includes an NPN type transistor 180 having a base 181, a collector 182 and an emitter 183, and an NPN type transistor 184 having a base 185, a collector 186 and emitter 187.

A Zener diode 190 has a cathode connected by a conductor 191 to the emitter 187 and an anode connected by conductor 195 through a resistor 194 to the negative terminal of a battery 202 having a positive terminal connected to ground at 206. The collector 186 is connected by resistor 189 to the positive terminal of the battery 198 having a negative terminal connected to ground through 200.

The collector 182 is connected at point 199 to the positive terminal of the battery 198 while the emitter 183 is connected by conductor 207 and a resistor 188 to the negative terminal of the battery 202 at point 204. The base 185 of transistor 184 is connected by conductor 208 to a point 209 on the conductor 207 while a capacitor 192 is shunted across the Zener diode 190. An output is connected at point 196 on conductor 195.

The Zener diode 190 shifts the level of the output voltage at the point 196 to achieve an optimum output. The emitter follower circuit 165 imparts low impedance, high output current characteristics to the system. The output of the emitter follower 165 at the output terminal 196 is coupled to the indicating network 25, shown in FIGURE 1, and which may be of a conventional type through a conductor 210 and to the attenuator 15 shown schematically in FIGURE 1 and in detail in FIGURE 3, through a conductor 212.

In summary, therefore, the forward amplifier 10 provides the amplifier network embodied in the present invention with high frequency response characteristics by blocking direct current, low frequency input signals from the variable direct current voltage signal source 20 with the resistance-capacitance network 24. Coupling the input signal to the forward amplifier 10 in this manner provides for passage to the forward amplifier 10 of only the high frequency, transient portion of the input signal from the direct current source 20.

The forward amplifier 10 acts to compare the input from the direct current voltage signal source 20 with the output of the backward amplifier 17, with the transistor 44 being connected to the direct current voltage signal source 20 and the transistor 81 being connected to the backward amplifier 17. The base 43 of the transistor 44 is provided with a supply voltage taken at the point 53 with this voltage raised to a level above the bootstrap supply voltage $(V_b+V_1)$ provided by the power supply 22, of FIGURE 5, by the action of the Zener diodes 60 and 62 of FIGURE 2. The collectors 45 and 86 of the transistors 44 and 81 are coupled through the resistors 100 and 102 to the conductor 55 leading to the aforementioned supply voltage at the point 53. The emitters 46 and 87 of the transistors 44 and 81 are coupled through a common resistor 94 to the conductor 48 carrying the bootstrap voltage $V_b$.

The output of the input stage of the amplifier 10, including the transistors 44 and 81, is connected from the collector 45 of the transistor 44 to the base 115 of the transistor 116. This signal is amplified by the transistor 116 and is coupled to the emitter follower 165 having the transistors 116 and 184 arranged so that a low impedance output is provided at the output terminal 196 of the emitter follower 165. This low impedance output is coupled to the indicating network 25 and to the attenuator 15 shown in FIGURE 1 through the conductors 210 and 212 respectively.

*Bootstrap amplifier*

In reference to FIGURE 3, the output of the forward amplifier 10, shown in the block diagram of FIGURE 1 and in detail in FIGURE 2, is coupled to the bootstrap amplifier 12 through the attenuator 15 by the output conductor 212 of the forward amplifier 10 being connected to an input terminal 216 of the attenuator 15. For purposes of illustration, the attenuator 15 may be a two step attenuator providing for unity or a gain of ten and also having a constant output impedance. The attenuator 15 includes a resistor 217 coupled to a resistor 218 through conductors 219 and 220 joining at the input terminal 216 and a resistor 221 coupled to the resistor 217 through a conductor 222, with the resistor 221 coupled to the resistor 217 through a conductor 222, with the resistor 221 further connected to a grounded conductor 223. The desired gain is selected by the relay 27 having a switch arm 224 arranged in cooperative relation with contacts 225 and 226. The relay 27 is controlled by a relay coil 227 having one terminal thereof connected to the positive terminal of an external direct current source or battery 228 through a switch 233, which may be of the bi-polar type, and the other terminal connected to a grounded conductor 234. The direct current source or battery 228 has a negative terminal connected to a grounded conductor 235. Manual operation of the switch 233 by the operator will activate the relay 27 causing the relay switch arm 224 biased by a spring 244 into contacting relation with contact 225 to switch from contact 225 for unity gain to contact 226 for a gain of ten. The attenuator 15, therefore, may select either the full or a portion of the output of the forward amplifier 10 and acts to couple the output so selected to the bootstrap amplifier 12.

The output of the attenuator 15 is coupled to an NPN type transistor 251 of the bootstrap amplifier 12, with the transistor 251 having a base 252, a collector 253 and an emitter 254. The output of the attenuator 15 which is coupled through a resistor 255 and an output conductor 256 to the base 252 of the transistor 251, is further coupled to a reference resistor 257 through a conductor 258 joining the conductor 256 at a point 259, with the resistor 257 connected to the conductor 48 carrying the bootstrap voltage $V_b$ through a conductor 260 joining the conductor 48 at a point 261. The output $V_b$ of the bootstrap amplifier 12, generated as now being explained, is directed back to the bootstrap amplifier 12 as an input to an NPN type transistor 262 of the bootstrap amplifier 12, with the transistor 262 having a base 263, a collector 264, and an emitter 265. A conductor 266 joins the conductor 48 carrying the bootstrap voltage $V_b$ at a point 267 with the bootstrap voltage $V_b$ being directed through the conductor 266, a resistor 269 and a conductor 270 to the base 263 of the transistor 262. The transistors 251 and 262 are a matched pair, physically located in the same container, so as to provide good isolation against thermal variations and transistor parameters. The transistors 251 and 262, therefore, act to compare the output of the forward amplifier 10, shown in FIGURE 1 and FIGURE 3, as selected by the attenuator 15, to the bootstrap voltage $V_b$ generated as an output of the bootstrap amplifier 12, with this output coupled back to the transistor 262 of the bootstrap amplifier 12 as an input voltage.

The emitter 254 of the transistor 251 and the emitter 265 of the transistor 262 are coupled to a negative referenced bootstrap supply voltage $(V_b-V_3)$ generated in a manner hereinafter explained, at power supply 22 of FIGURE 5, through resistors 270 and 272, respectively, a conductor 273, a resistor 274 and a conductor 276 leading from the power supply 22. The resistor 274 is of a magnitude so as to provide a nearly constant current drain for the transistors 251 and 262.

The emitter 254 of the transistor 251 is further coupled by a conductor 278 to a collector 280 of a PNP type transistor 281 with the transistor 281 having a base 282 and an emitter 283. The collector 253 of the transistor 251 is connected to the base 282 of the transistor 281 by a conductor 284. In a similar manner, the emitter 265 of the transistor 262 is connected by a conductor 288 to a collector 286 of a PNP type transistor 287 with the transistor 287 having a base 289 and an emitter 290. The collector 264 of the transistor 262 is connected to the base 289 of the transistor 287 by a conductor 291. The transistor 251 acting with the transistor 281 and the transistor 262 acting with the transistor 287 provide NPN-PNP feedback pairs which impart stable gain characteristics to the circuit, with the dependence upon the parameters of the transistors greatly reduced.

The emitter 283 of the transistor 281 and the emitter 290 of the transistor 287 join a conductor 292 through a resistor 294 and a resistor 296, respectively. The conductor 292 is connected to a positive referenced bootstrap supply voltage $(V_b+V_2)$ provided by the power supply 22 of FIGURE 5 which supplies power to the transistors 281 and 287 through the resistors 294 and 296, respectively, and which is generated in a manner as will be hereinafter described. A capacitor 295 is connected across the resistor 294 to improve frequency response of the amplifier circuit.

A potentiometer 298 is utilized to null the bootstrap amplifier 12 so that its output coupled through the conductor 48 is equal to its input from the forward amplifier 10, as selected by the attenuator 15. The potentiometer 298 is externally adjustable by an operator-operative arm 299 of the potentiometer 298 cooperatively arranged to adjust a resistor element 300 with the arm 299 joining the conductor 292 through a conductor 301 at a point 302.

The adjustable resistor element 300 is in turn connected at one end to the conductor 284 and at the other end to the conductor 291. The conductor 284 electrically connects the collector 253 of the transistor 251 to the base 282 of the transistor 281 while the conductor 291 connects the collector 264 of the transistor 262 to the base 289 of the transistor 287 so that adjustment of the arm 299 of the potentiometer 298 serves to adjust the effective supply voltage applied to the collector and base of the respective transistors 251–281, and 262–287, and thereby the differential relationship between the input voltage applied at base 252 of transistor 251 and the base 263 of the transistor 262. The potentiometer is adjusted by the operator so as to effect an output at conductor 48 which is always equal to the input at the input point 259 of the bootstrap amplifier 12.

The differential output of the transistors 281 and 287 is coupled to a second amplifying stage of the bootstrap amplifier 12 consisting of NPN type transistors 304 and 306. The transistor 304 has a base 307, a collector 308, and an emitter 309 and the transistor 306 has a base 310, a collector 311 and an emitter 312. The output of the transistor 287 at the emitter 290 thereof is coupled through a conductor 314 to the base 307 of the transistor 304. The output of the transistor 281 at the emitter 283 thereof is coupled through a conductor 315 to the base 310 of the transistor 306. The transistors 304 and 306 are similar to the transistors 251 and 262 with the transistors 304 and 306 also being thermally matched and physically located in the same container in order to reduce any errors due to transistor parameters and thermal variations.

Figure 5:
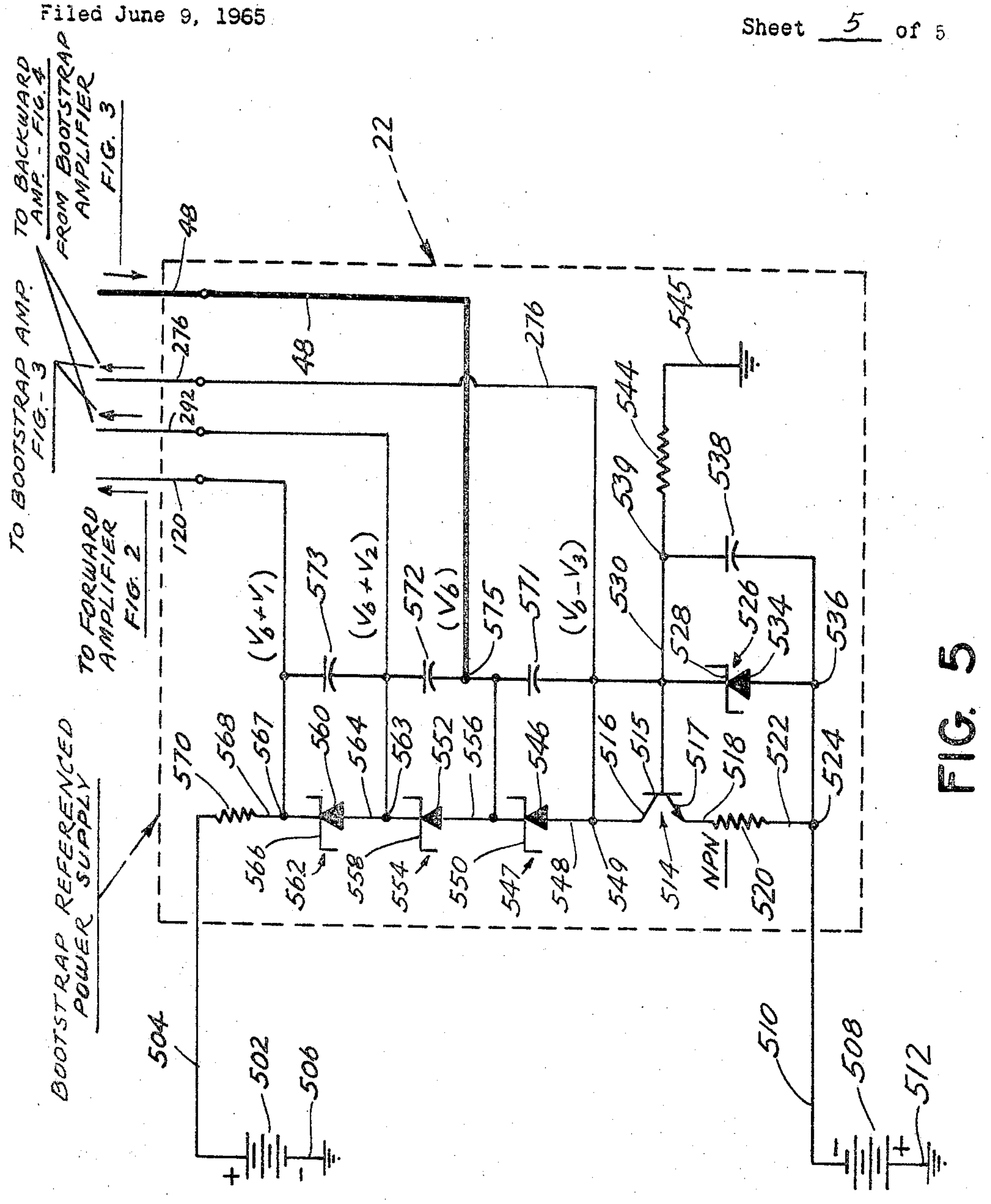
FIGURE 5 is a schematic wiring diagram of the bootstrap referenced power supply circuit used to generate supply voltages for the various amplifiers included in the direct current amplifier network of the present invention.

The emitter 309 of the transistor 304 and the emitter 312 of the transistor 306 are coupled to the conductor 276 leading from the bootstrap referenced supply voltage $(V_b-V_3)$ of the power supply 22 of FIGURE 5, through a conductor 322, a resistor 324 and a conductor 326. The resistor 324 functions as a constant current control for the matched transistor pair including the transistor 304 and the transistor 306. The collector 308 of the transistor 304 and the collector 311 of the transistor 306 are connected through the resistors 328 and 330 to the bootstrap referenced supply voltage $(V_b+V_2)$ applied at conductor 292 by the power supply 22 of FIGURE 5. The resistors 328 and 330 join the conductor 292 at points 332 and 334 respectively.

The output of this stage of the bootstrap amplifier 12 is taken at the collector 311 of the transistor 306 and directed through a conductor 340, a resistor 342, shunted by a capacitor 346 to an input terminal 352 of an emitter follower device 355. The capacitor 346 across the resistor 342 acts to impart the proper frequency response to the circuit. The emitter follower 355 is similar in operation to the emitter follower 165 shown in FIGURE 2 and has corresponding parts indicated by like numbers to which have been applied the suffix A. The capacitor 170A and the resistor 172A act to stabilize the circuit and the transistors 180A and 184A are biased by the direct current supplies 202A and 198A and function in a manner identical to that shown in FIGURE 2 and the description thereof. The emitter follower 355, therefore, acts to provide the bootstrap amplifier 12 with a low impedance high current output. This output, which is the bootstrap amplifier output, is taken at the output terminal 196A of the emitter follower 355 and connected, as herein discussed, through the conductor 48.

In summary, therefore, the bootstrap amplifier 12 selects through the attenuator 15 either all or a portion of the output of the forward amplifier 10. The voltage so selected is coupled to a transistor 251. Another input to the bootstrap amplifier 12 is from its output at conductor 48. This input is coupled to the transistor 262, with the transistors 251 and 262 being matched and located in the same container to isolate the circuit from the effects of transistor parameters. The output of the forward amplifier 10 selected by the attenuator 15 and the bootstrap voltage generated by the bootstrap amplifier 12 are thus compared by the transistors 251 and 262. The transistors 251 and 262 acting with the transistors 281 and 287 provide stable gain to the circuit, with the circuit also being independent of the transistor parameters.

The potentiometer 298 provides an external operator-operative adjustment which is so adjusted that the output of the bootstrap amplifier 12 always equals the input at point 259 from the forward amplifier 10 as selected by the attenuator 15 and corrected by the output feedback through resistor 257 and conductors 48, 260 and 258.

The differential output from the transistors 281 and 287 is coupled to a second amplification stage in the bootstrap amplifier 12 including the matched transistors 304 and 306. The amplified output from this stage is taken from the collector 311 of the transistor 306 and directed through an emitter follower 355 so as to obtain low impedance output characteristics. This low impedance bootstrap voltage, therefore, may be coupled back through conductor 48, conductor 260, resistor 257 and conductor 258 as an input to the bootstrap amplifier 12 and may also provide bootstrap referenced positive or negative supply voltages to the several amplifiers as will be explained in reference to FIGURE 5.

*Backward amplifier*

In reference to FIGURE 4, the backward amplifier 17 acts to compare the input from the variable direct current voltage signal source 20, shown in FIGURE 1, with the output of the bootstrap amplifier 12, shown in FIGURE 3, in order to provide an amplified error voltage. This error voltage is applied as an input to the forward amplifier 10 so that the output of the forward amplifier 10 will have a relation to the input from the direct current voltage signal source 20 depending upon the attenuation ratio of the attenuator 15, as heretofore noted.

The output from the variable direct current voltage signal source 20 is connected to an input terminal 358 of the backward amplifier 17 through a conductor 360 joining the output conductor 31 of the direct current voltage signal source 20 at a point 361 shown in FIGURE 2. A resistor 362 and a conductor 363 lead to an input terminal 365 of the backward amplifier 17. This input is coupled from the input terminal 365 to a base 367 of an NPN type transistor 369 through a conductor 370. The transistor 369 has an emitter 371 and a collector 373 and is referenced to the bootstrap voltage $V_b$ at conductor 48 through a resistor 379 by the conductor 370 joining a conductor 381 at a point 380. The resistor 379 is connected to the bootstrap conductor 48 carrying the output $V_b$ of the bootstrap amplifier 12, as shown in FIGURE 3, at a point 382 through a conductor 383.

The output from the bootstrap amplifier 12 shown in FIGURE 3, and carried by the conductor 48, is coupled to a base 384 of an NPN type transistor 385 through a conductor 386 joining the bootstrap conductor 48 at a point 387, the resistor 388 and a conductor 389. The transistor 385 has an emitter 390 and a collector 391. The transistors 369 and 385 are a matched pair, physically located in the same container to provide good isolation against thermal variations and transistor parameters. The emitter 371 of the transistor 369 and the emitter 390 of the transistor 385 are connected to a common resistor 392 through a conductor 393 and a resistor 394 and a conductor 395 and a resistor 396 respectively. The resistor 392 is coupled through a conductor 276 to a negative referenced bootstrap supply voltage $(V_b-V_3)$ generated at the power supply 22 of FIGURE 5 in a manner as will be hereinafter explained. The supply voltage $(V_b-V_3)$ at the conductor 276 is of such a magnitude as to provide a nearly constant current drain for the transistors 369 and 385 in conjunction with resistor 392.

The transistors 369 and 385 act in conjunction with two PNP type transistors 400 and 402. The transistor 400 has a base 404 connected through a conductor 405 to a collector 373 of the transistor 369, a collector 407 connected through a conductor 409 to the emitter 371 of the transistor 369 and an emitter 410 connected through a conductor 411 and resistor 413 to the conductor 292 leading from the supply voltage $(V_b+V_2)$ generated at the power supply 22 of FIGURE 5. The transistor 400 acts with the transistor 369 to provide an NPN-PNP feedback pair providing stable gain characteristics independent of the transistor parameters. Similarly, the transistor 402 has a base 414 connected through a conductor 415 to a collector 391 of the transistor 385, a collector 417 connected through a conductor 419 to the emitter 390 of the transistor 385, and an emitter 420 connected through a conductor 421 and resistor 423 to the conductor 292 leading from the supply voltage $(V_b+V_2)$ of the power supply 22 of FIGURE 5. The transistor 402 acts with the transistor 385 to provide another NPN-PNP type feedback pair to provide stable gain characteristics.

A potentiometer 428 has an adjustable resistor element 430 connected at one end through a conductor 439 and a resistor 440 to the conductor 405 leading to the collector 373 of the transistor 369 and another end of the adjustable resistor element 430 connected through a conductor 442 and a resistor 444 to the conductor 415 leading to the collector 391 of the transistor 385. The resistor element has an operator-operative adjustable arm 446 connected through a conductor 448 to the conductor 292 leading from the positive referenced bootstrap supply voltage $(V_b+V_2)$ generated at the power supply 22 of FIGURE 5 in a manner as will be hereinafter explained. The arm 446 of the potentiometer 428 is adjusted by the operator to null the backward amplifier 17 so that the differential output at the emitter 410 of the transistor 400 and at the emitter 420 of the transistor 402 is zero when equal inputs are applied to the base 367 of the transistor 369 from the variable direct current voltage signal source 20, and to the base 384 of the transistor 385 from the bootstrap amplifier 12.

The differential output from the emitter 410 of the transistor 400 and from the emitter 420 of the transistor 402 is coupled to a second stage of the backward amplifier 17 including a transistor 452, having a base 453, a collector 454 and an emitter 455 and a transistor 456 having a base 457, a collector 458, and an emitter 459. The collector 454 of the transistor 452 is coupled through a conductor 460 and resistor 462 to the conductor 292 leading from the bootstrap referenced supply voltage $(V_b+V_2)$ at the power supply 22 while the collector 458 of the transistor 456 is coupled through a conductor 464 and resistor 466 to the conductor 292 leading from the bootstrap referenced supply voltage $(V_b+V_2)$. The emitter 420 of the transistor 402 is coupled to the base 453 of the transistor 452 through a conductor 468, a resistor 470 and a conductor 472. The emitter 410 of the transistor 400 is coupled to the base 457 of the transistor 456 through a conductor 473, a resistor 474, and a conductor 475. Similar to the transistors 369 and 385, the transistors 452 and 456 are thermally matched and are included in the same container in order to reduce any errors due to transistor parameters and thermal variations. The emitter 455 of the transistor 452 and the emitter 459 of the transistor 456 are coupled to the conductor 478 leading to the negative referenced bootstrap supply voltage $(V_b-V_3)$ applied at conductor 276 and through resistor 479 and a conductor 480. The resistor 479 coupled in the aforenoted manner to the conductor 276 carrying the negative referenced bootstrap supply voltage $(V_b-V_3)$ generated at the power supply 22 acts as a constant current control device for the transistors 452 and 456.

The output of the backward amplifier 17 is taken from the collector 454 of the transistor 452 and is coupled to the output conductor 75 of the backward amplifier 17 at a point 486 through a conductor 487 and a resistor 488. A resistor 489 is connected to the output conductor 75 of the bootstrap amplifier 12 by a conductor 490 and to the conductor 276 carrying the negative referenced bootstrap supply voltage $(V_b-V_3)$ from the power supply 22. The resistor 488 and the resistor 489 act to shift the level of the output of the backward amplifier 17 applied at conductor 75 and which is coupled as an input at terminal 77 to the forward amplifier 10, as shown in FIGURES 1 and 2 by the conductor 75.

In summary, therefore, the backward amplifier 17, shown in FIGURE 4, compares the input from the variable direct current voltage signal source 20 to the output of the bootstrap amplifier 12 of FIGURE 3 by coupling the input from the variable direct current voltage signal source 20 to the transistor 369 and coupling the output of the bootstrap amplifier 12 to the transistor 385. Stable gain characteristics are obtained by coupling the transistor 369 and the transistor 385, and the transistor 400 and the transistor 402 as NPN–PNP feedback pairs.

The potentiometer 428 is adjusted by the operator so as to null the backward amplifier 17 so that no output is obtained at conductor 75 when equal inputs are applied to the transistor 369 and the transistor 385.

The differential output from the transistors 400 and 402 is coupled to a second amplifying stage of the backward amplifier 17 including the transistors 452 and 456. The output of the amplifier 17 taken from the collector 454 of the transistor 452 may therefore be coupled as an input to the forward amplifier 10 applied through the conductor 75, as shown in FIGURE 1 and FIGURE 2. This input acts to correct the output of the forward amplifier 10, which is the output of the amplifier network, so that the output of the amplifier network bears a relation to the input from the variable direct current voltage signal source 20 as heretofore noted.

*Bootstrap referenced power supply*

As has been noted throughout the description of the preceding circuitry, the forward amplifier 10, the bootstrap amplifier 12 and the backward amplifier 17 receive power from a power supply 22 which provides voltages floating above and below the bootstrap voltage $V_b$ generated by the bootstrap amplifier 12, shown in FIGURE 3, and carried by the conductor 48.

In reference to the bootstrap referenced power supply 22 of FIGURE 5, the circuitry provided for generating these bootstrap reference voltages is shown therein. A source of direct current or a battery 502 has its positive terminal connected to a conductor 504 and its negative terminal connected to a common ground through a conductor 506. Another source of direct current or a battery 508 has its negative terminal connected to a conductor 510 and a positive terminal connected to a common ground through a conductor 512. An NPN type transistor 514 having a base 515, a collector 516 and an emitter 517 has the emitter 517 coupled to the conductor 510 through a conductor 518, a resistor 520 and a conductor 522, joining the conductor 510 at a point 524. A Zener diode 526 is connected across the base 515 of the transistor 514 and the conductor 510 leading to negative terminal of the battery 508. A cathode 528 of the Zener diode 526 is joined to a conductor 530 leading to the base 515 of the transistor 514. An anode 534 of the Zener diode 526 is joined to the conductor 510 at a point 536. A high frequency bypass capacitor 538 has one plate joined to the conductor 530 leading to the base 515 of the transistor 514 at a point 539 and has another plate joined to the conductor 510. The conductor 530 leading to the base 515 of the transistor 514 is connected to a common ground through a resistor 544 and a conductor 545.

The collector 516 of the transistor 514 is connected to an anode 546 of a Zener diode 547 by a conductor 548. A cathode 550 of the Zener diode 547 is connected to an anode 552 of another Zener diode 554 through a conductor 556. The cathode 558 of the Zener diode 554 is connected to the anode 560 of the Zener diode 562 through a conductor 564. A cathode 566 of the Zener diode 562 is coupled to the conductor 504 leading to the positive terminal of the battery 502 through a conductor 568 and a resistor 570.

The Zener diode 526 operably connected to the direct current source 508 and to the base 515 of the transistor 514 acts to limit the voltage applied to the transistor 514 and hence provide a constant source of current to the Zener diodes 547, 554 and 562. The Zener diodes 547, 554 and 562, having voltage limiting characteristics, are biased by the bootstrap supply voltage $V_b$ to provide supply voltages at some constant value above and below the bootstrap voltage, as will be next described. Suitable filter or high frequency bypass capacitors 571, 572 and 573 are connected across the respective Zener diodes 547, 554 and 562.

An output conductor 276 is joined to the conductor 548 coupling the collector 516 of the transistor 514 and the anode 546 of the Zener diode 547 at a point 549. The output conductor 276 carries a supply voltage referenced at some level below the bootstrap voltage $V_b$ with this supply voltage provided by the Zener diode 547 being reverse biased by the bootstrap voltage $V_b$ carried by the conductor 48 to the cathode 550 of the Zener diode 547. This voltage ($V_b-V_3$) so generated is supplied, as shown by FIGURE 1, through conductor 276 to circuitry for the bootstrap amplifier 12 of FIGURE 3, and through conductor 276 to the circuitry for the backward amplifier 17 of FIGURE 4.

The Zener diodes 554 and 562 provide a supply voltage at some constant value above the bootstrap voltage $V_b$ by the Zener diode 554 being forward biased by the bootstrap voltage $V_b$ carried by the conductor 48 to the anode 552 of the Zener diode 554. This voltage ($V_b+V_2$) is directed along the output conductor 292 which joins at point 563 the conductor 564 connecting the cathode 558 of the Zener diode 554 and the anode 560 of the Zener diode 562. The voltage so carried by the conductor 292, as shown by FIGURE 1, is supplied to the circuitry for the bootstrap amplifier 12 of FIGURE 3 and through conductor 292 to the circuitry for the backward amplifier 17 of FIGURE 4.

Another supply voltage referenced above the bootstrap supply $V_b$ is provided by an output conductor 120 leading to the forward amplifier 10 of FIGURE 2. The voltage ($V_b+V_1$) so provided by forward biasing the Zener diode 562 as heretofore noted for the Zener diode 554 is supplied to the circuitry for the forward amplifier 10 of FIGURE 2. The bootstrap voltage $V_b$ provided as a reference for the aforenoted supply voltages is coupled along the conductor 48 leading from an output terminal 196A, shown in FIGURE 3, to an input terminal 575 of the bootstrap power supply circuitry shown in FIGURE 5.

In summary, therefore, the bootstrapped referenced power supply 22 has as its input the bootstrap voltage $V_b$ generated by the bootstrap amplifier 12 as shown in FIGURE 3, and provides outputs floating above or below the bootstrap voltage $V_b$. The various outputs or supply voltages are provided with a level above or below the bootstrap voltage $V_b$ by the several Zener diodes connected as shown in FIGURE 5. These supply voltages are in turn coupled to the various amplifiers of the direct current amplifier network embodied in the present invention so as to provide these amplifiers with appropriate floating power supplies.

*Operation*

With the direct current amplifier network generally described with reference to FIGURE 1, and the several circuits embodied in the present invention described in detail with reference to FIGURES 2, 3, 4 and 5, a typical mode of operation of the amplifier network may now be explained with reference to all of the figures included herein.

In operation, therefore, a direct current signal is coupled to the forward amplifier 10 through a resistance capacitance network 24. The forward amplifier 10 is thus responsive to only the high frequency, alternating current characteristics of the variable direct current voltage signal source 20 and hence imparts these characteristics to the amplifier network.

The forward amplifier 10, being a differential amplifier, compares the input from the variable direct current voltage signal source 20 with an output which is provided by the backward amplifier 17. The output from the backward amplifier 17 acts to correct the output of the forward amplifier 10 so that this forward amplifier 10 output will have a relationship to the input from the variable direct current voltage signal source 20. The output of the forward amplifier 10 is also the output of the amplifier network and may further be coupled for subsequent use in a system which may, for purposes of example, be an analog to digital computer.

The output of the forward amplifier 10 may also be coupled to the other components of the amplifier network by connecting the output of the forward amplifier 10 as an input to the bootstrap amplifier 12 through an attenuator 15. The attenuator 15 is provided so that either all or a portion of the output of the forward amplifier 10 may be coupled as an input to the backward amplifier 17. The bootstrap amplifier 12, also being a differential amplifier, requires another input to which the input from the forward amplifier 10, as selected by the attenuator 15 may be made. This other input to the bootstrap amplifier 12 is provided by its own output at conductor 48. A potentiometer adjustment arm 299 is provided within the bootstrap amplifier 12 and so adjusted by the operator that the input at terminal 259 from the forward amplifier 10 may always equal the output 48 from the bootstrap amplifier 12 which, due to the bootstrap action of the circuitry involved provides another input to the bootstrap amplifiers 12, as shown in FIGURE 3.

As heretofore noted, the output 75 of the backward amplifier 17 provides an input to the forward amplifier 10. This output 17 is provided by coupling to the input of the backward amplifier 17 which is also a differential amplifier, the input conductor 360 from the variable direct current voltage signal source 20 and an output conductor 48 from the bootstrap amplifier 12 to which there is applied a voltage $V_b$ generated as previously noted. The output of the backward amplifier 17 applied at conductor 75 is in reality a correction voltage acting to correct the voltage applied at the output conductor 212 of the forward amplifier 10 of FIGURE 2 which is also the output of the amplifier network, so that this output at conductor 210 leading to the indicator network 25 bears a relation to the input at terminal 35 from the variable direct current voltage signal source 20 and depends on the output of the forward amplifier 10 which is selected by the attenuator 15 as an input to the bootstrap amplifier 12.

The various amplifiers included in the network embodied in the present invention require a source of power supply voltages in order to be operable. These supply voltages are generated by an output of the bootstrap amplifier 12 of FIGURE 3 at conductor 48 being coupled to a transistor 514 of the power supply 22 of FIGURE 5, providing a constant source of current and to various Zener diodes 547, 554 and 562 which provide voltages floating above and below the bootstrap voltage $V_b$ applied at conductor 48 by constant amounts.

The network described herein provides a useful direct current amplifier which provides a signal having a relationship to a direct current input signal. The various circuits included in this amplifier network are arranged so that the resulting amplifier, operable over a wide frequency band width, has high input impedance characteristics. Moreover, the amplifier is made a variable gain device and is highly stable due to the arrangement of the solid state components employed in the associated circuitry. These characteristics make the amplifier embodied in the present invention a desirable device, and should enjoy wide utility in the electronics field.

While one embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. An amplifier network for amplifying an input signal from a signal source, comprising:
- a forward amplifier connected to the signal source and responsive to the input signal therefrom for providing a first output signal;
- an attenuator connected to the forward amplifier for attenuating the first output signal;
- a bootstrap amplifier connected to the attenuator and responsive to the attenuated signal therefrom, and responsive to its own output signal applied through a feedback path for providing a second output signal;
- a backward amplifier connected to the bootstrap amplifier and connected to the signal source, and responsive to the second output signal and to the input signal for providing a third output signal; and
- the forward amplifier connected to the backward amplifier and affected by the third output signal therefrom so that the first output signal from said forward amplifier is related to the input signal as a function of the attenuated first output signal.

2. An amplifier network as described by claim 1, wherein the forward amplifier comprises:
- a differential amplifier having an input-output stage connected to the signal source and to the backward amplifier for comparing the input signal to the third output signal;
- an amplification stage for amplifying the comparison signal; and
- an emitter follower connected to the amplification stage for imparting low impedance characteristics to the amplified signal and for providing the first output signal.

3. An amplifier network as described by claim 1, wherein the bootstrap amplifier comprises:
- a differential amplifier having an input-output stage connected to the attenuator for comparing the attenuated first output signal to its own output signal;
- a potentiometer connected to the differential amplifier for adjusting the output signal therefrom so that said signal is equal to the first output signal;
- an amplification stage connected to the potentiometer for amplifying the output signal therefrom; and
- an emitter follower connected to the amplification stage for imparting low impedance characteristics to the amplified signal and for providing the second output signal.

4. An amplifier network as described by claim 1, wherein the backward amplifier comprises:
- a differential amplifier having an input-output stage connected to the signal source and to the bootstrap amplifier for comparing the input signal to the second output signal;
- a potentiometer connected to the differential amplifier for adjusting the output signal therefrom so that said signal is zero when the input signal equals the second output signal; and
- an amplifying stage connected to the potentiometer for amplifying the output signal therefrom and for providing the third output signal.

5. An amplifier network as described by claim 3, including:
- a power supply for providing voltages floating at predetermined constant levels above and below the second output signal from the bootstrap amplifier; and
- said power supply being connected to the forward, bootstrap and backward amplifiers for supplying power thereto.

6. An amplifier network as described by claim 5, wherein the power supply includes:
- first current flow control means connected to the bootstrap amplifier and responsive to the second output signal therefrom for providing a supply voltage floating at one constant level above the second output signal;
- second current flow control means connected to the bootstrap amplifier and responsive to the second output signal therefrom for providing a supply voltage floating at another constant level above the second output signal;
- third current flow control means connected to the bootstrap amplifier and responsive to the second output therefrom for providing a supply voltage floating at a constant level below the second output signal; and
- the forward amplifier being connected to the first current flow control means, the backward amplifier being connected to the second current flow control means and the bootstrap amplifier being connected to the third current flow control means.

7. An amplifier network for amplifying an input signal from a signal source, comprising:
- a forward amplifier connected to the signal source and responsive to the input signal therefrom for providing a first output signal having high frequency response characteristics;
- a bootstrap amplifier connected to the forward amplifier and responsive to the first output signal therefrom for providing a second output signal having variable gain characteristics;
- a backward amplifier connected to the bootstrap amplifier and connected to the signal source and responsive to the second output signal and to the input signal therefrom for providing a third output signal;
- the forward amplifier connected to the backward amplifier and responsive to the third output signal therefrom so that the first output signal has a predetermined relation to the input signal;
- means connected to the bootstrap amplifier and responsive to the second output signal therefrom for providing supply voltages; and
- the forward, backward and bootstrap amplifiers being connected to the last mentioned means so as to be driven by the supply voltages therefrom.

8. An amplifier network as described by claim 7, wherein the last mentioned means includes:
- a first Zener diode connecting the second output signal to the forward amplifier to provide a supply voltage thereto floating at one constant level above the second output signal;
- a second Zener diode connecting the second output signal to the backward amplifier to provide a supply voltage thereto floating at another constant level above the second output signal; and
- a third Zener diode connecting the second output signal to the bootstrap amplifier to provide a supply voltage thereto floating at a constant level below the second output signal.

References Cited

UNITED STATES PATENTS

| | | | |
|---|---|---|---|
| 2,922,114 | 1/1960 | Runyan | 330—9 |
| 3,101,451 | 8/1963 | Burgarella et al. | 330—9 X |

NATHAN KAUFMAN, *Primary Examiner.*

U.S. Cl. X.R.

330—156, 85, 199, 151